July 2, 1968 R. BOSSE ETAL 3,391,347

RESONANT CIRCUITS WITH SWITCHABLE CAPACITIVE TUNING DIODES

Filed Nov 23, 1966 2 Sheets-Sheet 1

INVENTORS:
Rolf Bosse
Ernst Klettke
Herbert Schlegel
BY Spencer & Kaye
ATTORNEYS INVENTORS:
Rolf Bosse
Ernst Klettke
Herbert Schlegel
BY Spencer & Kaye
ATTORNEYS United States Patent Office 3,391,347

Patented July 2, 1968

3,391,347
RESONANT CIRCUITS WITH SWITCHABLE CAPACITIVE TUNING DIODES

Rolf Bosse, Benthe, Ernst Klettke, Hannover, and Herbert Schlegel, Havelse, Hannover, Germany, assignors to Telefunken Patentverwertungsgesellschaft m.b.H., Ulm (Danube), Germany Filed Nov. 23, 1966, Ser. No. 596,571
Claims priority, application Germany, Nov. 23, 1965, T 29,821; May 28, 1966, T 31,261
8 Claims. (Cl. 330—31)

ABSTRACT OF THE DISCLOSURE

Two capacitive diodes having different capacitances are connected in series with an inductance to form a resonant circuit. A fixed and an adjustable voltage are interchangeably connected through a switch to the diodes to tune the circuit over large frequency ranges in the UHF region. In one switch position a first of the diodes will be reverse biased so that its capacitance can be tuned to resonate with the inductance in one frequency band while the second diode is forward biased to be conductive. Similarly, with the reverse switch position, the diode conditions will be reversed to tune the circuit over a second frequency band.

The present invention relates to an electrical circuit using capacitive diodes, and more particularly, to a circuit for resonating in different frequency bands, such as television frequency bands I and III and/or IV and V by using capacitive diodes.

In oscillators tuned by a capacitive diode the provision of additional capacitive diodes applied to different tapping points on the inductor of the resonant circuit is known. In this way, for each of the tapping points, a short circuiting or a transformation of the main tuning capacitance can be chosen from the parallel circuits. However, the use of a plurality of taps on an inductor leads to many difficulties. For example, it is difficult to provide input and output couplings to the inductors which are arranged in series.

With this in mind, it is an object of the present invention to provide a new and improved tuned circuit arrangement using capacitive diodes.

Another object of the present invention is to provide a new and improved tuned circuit arrangement using capacitive diodes wherein the total inductance of the oscillatory resonant circuit is used for different frequency bands.

These objects and others ancillary thereto are accomplished in accordance with preferred embodiments of the invention wherein there is provided an electrical circuit capable of oscillating in a plurality of different frequency regions. It includes an oscillatory resonant circuit having an inductor. A plurality of capacitive diodes are arranged in series with the inductor. The capacitance of a first of the capacitive diodes is selected to resonate with the inductance of the inductor in a first preselected frequency region. The capacitance of a second of the diodes is selected to resonate with the inductance in a second preselected frequency region. Voltage means are connected in circuit with the diodes for varying the conductive conditions and the capacitance of the diodes whenever desired.

Additional objects and advantages of the present invention will become apparent upon consideration of the following description when taken in conjunction with the accompanying drawings in which.

Figure 1:
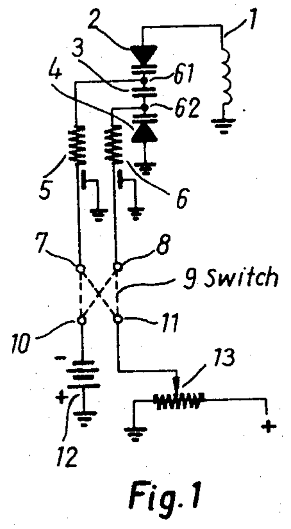
FIGURE 1 is an electrical schematic diagram illustrating the principles of the present invention.

Referring to the drawings and, more particularly, to FIGURE 1, the resonant circuit inductance is represented by the inductor 1. One end of the inductor 1 is connected to a reference potential such as ground while the other end is connected to one electrode of a capacitive diode 2, the other electrode of the diode 2 being connected to one side of a separating capacitor 3. The other electrode of the separating capacitor 3 is connected to a second capacitive diode 4 which is also connected to the reference potential.

The junction point 61 between the diode 2 and the capacitor 3 is connected by means of a resistor 5 to one terminal 7 of a reversing switch 9. The junction point 62 between the capacitor 3 and the diode 4 is connected by means of a resistor 6 to the terminal 8 of the reversing switch 9. The switch 9 has additional terminals 10 and 11. Terminal 10 is connected to one side of a fixed biasing potential source 12, the other side of which is connected to ground. The terminal 11 is connected to the movable tap of a potentiometer 13 which, in turn, is connected between a source of positive potential and ground.

The switch 9, diagrammatically illustrated, is a double pole, double throw switch which, in one position, connects terminals 7 and 10 together and 8 and 11 together, while in its other position it connects terminals 7 and 11 and terminals 8 and 10 together, respectively.

It can be seen that the diodes 2 and 4 are arranged with their cathodes opposing each other. Thus, the potential source 12 and the adjustable voltage of the potentiometer 13 can be arranged so that when the junction point 61 is connected through terminals 7 and 10 to the fixed source 12, the diode 2 will be in conductive position. At the same time, the junction point 62 would be connected through the terminals 8 and 11 to the potentiometer 13 and the diode 4 would have a blocking voltage applied thereto so that it would not conduct.

In the opposite position of the switch 9, the diode 2 would be blocked and the diode 4 would be in conductive condition. When the terminals 7 and 10 are connected together and the terminals 8 and 11 are connected together, the diode 2 is effectively short-circuited so that, in this switch position, only the diode 4 operates as a capacitive diode. The capacitance of the diode 4 would thereby be determined by the position of the potentiometer 13 which provides the variable or tuning voltage. Since the capacitance of the diode 4 is substantially smaller than the capacitance of the capacitor 3, the inductor 1 in this switch position would be parallel only to the capacitance of the diode 2. The basic capacitance of the diode 2 is so selected that this capacitance together with the inductance of the inductor 1 is tuned to a selected frequency band such as the band III.

In the other switch position with terminals 7 and 11 connected together and terminals 8 and 10 connected together, the basic capacitance is selected so that its capacitance together with the same inductance of the inductor 1 will be tuned to a second frequency band such as the band I. Also, in this case, the capacitor 3 does not operate as a capacitor because of its large size.

The circuit arrangement of FIGURE 1 has been tested for operation by using for the diode 2, the diode BAY70 (Telefunken type). This diode has a capacity of 5 pf.

when two volts are applied thereto and has a capacity of about 2 pf. when 50 volts are applied thereto.

For the diode 4, the capacitive diode BA124 (Telefunken type) has been used. Such diode has a capacity of 50–60 pf. with 2 volts applied thereto and a capacity of about 20 pf. with 50 volts applied thereto.

Trimmer capacitors (not shown in FIGURE 1) may be provided in parallel with the series circuit made up of the diodes 2 and 4 and the capacitor 3. For the diode 2, a trimmer capacitor having a capacitance of 0.5–5 pf. can be provided and for the diode 4 a trimmer capacitor having a capacitance of 10–40 pf. can be provided.

It can thus be seen, from the above arrangement, that the use of the two capacitive diodes permits tuning in one frequency band when the switch 9 is in one position and in a different frequency band when the switch 9 is in its other position. This makes the circuit particularly efficient when used in a UHF television tuner, for example.

Figure 2:
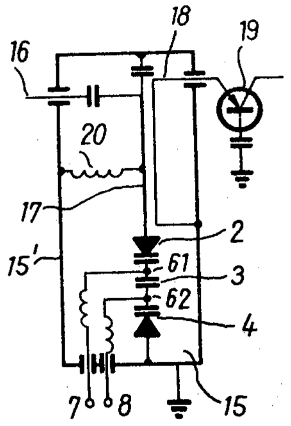
FIGURE 2 is an electrical schematic diagram of an embodiment incorporating the principles of the present invention.

Referring now to FIGURE 2, the circuit incorporating the principles of the present invention is shown as used with a conductor circuit which, for example, can be the input circuit of a UHF amplifier. The elements in FIGURE 2, which are the same as those in FIGURE 1, are identified by the same numerals.

The input signal to the circuit 15 is applied by means of the conductor 16 which can be a cavity coupler, a loop coupler or a capacitive coupler, for example. The circuit 15 includes the inner conductor 17, the electrically grounded housing illustrated by the dark outer line 15' and the tuning capacitor diodes 2 and 4.

The output signals from the resonant circuit 15 are applied by means of a loop coupling 18 to the input electrode of the amplifier transistor 19. These signals are then further amplified in a known manner.

The direct current path for the short circuiting position of the doide 2 is provided by the coil 20. The coil 20 is connected to the inner conductor 17 at a point representing a voltage null on the conductor 17. The capacitances of the diodes 2 and 4 are so selected in FIGURE 2 that the variation of their capacitance permits tuning in frequency band IV and in frequency band V. The length of the inner conductor 17 is advantageously chosen so that the circuit 15 operates using half-wave length techniques.

As in FIGURE 1, the junction points 61 and 62 between the diodes and the capacitor 3 are respectively connected to the terminals 7 and 8 of the switch 9. Thus, the operation of the embodiment shown in FIGURE 2 is similar to that explained in FIGURE 1. In this case, the inner conductor 17 provides the inductance for tuning the capacitances of the diodes 2 and 4 in the desired frequency bands.

Figure 3:
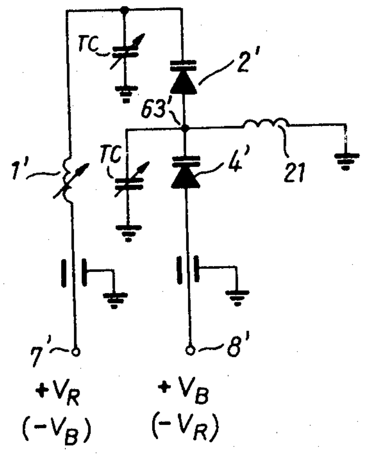
FIGURE 3 is an electrical schematic diagram of another embodiment of the present invention.

Referring now to FIGURE 3, a slightly different arrangement is shown. In FIGURE 3, the diodes 2' and 4', which are capacitive diodes, as before, have their electrodes directly connected together without a separating capacitor 3. In this illustrated embodiment, it can be seen that the diodes 2' and 4' are connected in the same polarity rather than with the opposing polarity as before. Actually, however, the opposing polarity arrangement can also be used.

In lieu of the separating capacitor 3, the junction point 63' between the diode 2' and the diode 4' is connected to a reference potential such as ground by means of a high frequency coil 21.

The cathode of the diode 2' is connected to one side of the inductor 1' representing the inductance of the resonant circuit. The opposite end of the inductor 1' is connected to the terminal 7'. The anode of the diode 4' is connected to a terminal 8'.

As before, the voltages are applied to the terminals 7' and 8' for tuning either the diode 2' or the diode 4' with the inductance of the inductor 1' of the resonant circuit. That is, the diodes 2' and 4' are respectively tuned for different frequency bands. Thus, to the terminals 7' and 8' can be respectively applied voltages $V_R$ and $V_B$. Also, voltages $-V_B$ and $-V_R$ can be applied, respectively, to the terminals 7' and 8' for tuning purposes. In FIGURE 3, trimming capacitors TC arranged in parallel with the diodes 2' and 4' are illustrated.

Figure 4:
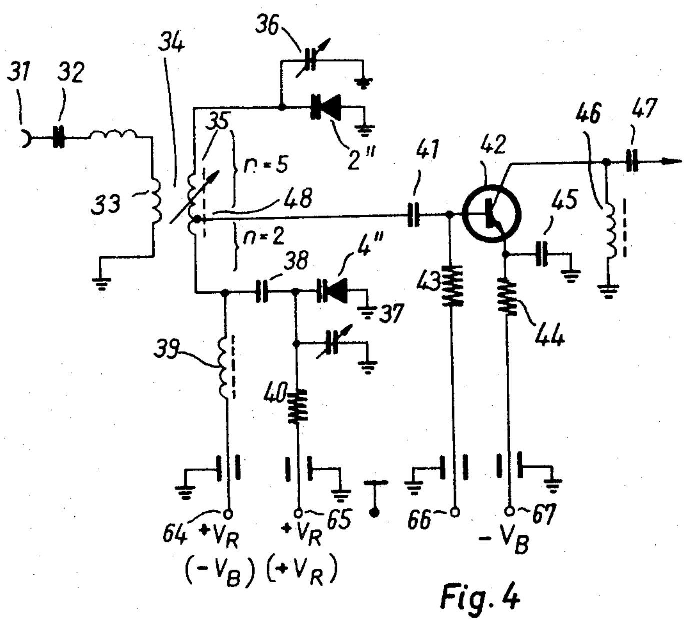
FIGURE 4 is an electrical schematic diagram illustrating a third embodiment of the present invention.

Referring now to FIGURE 4, a circuit for the reception of high frequency signals using the principles of the present invention is illustrated. The signals are applied to the circuit by means of the terminal 31. These signals can have a frequency corresponding to the frequency bands I and III or IV/V, respectively.

These high frequency signals are applied by means of a capacitor 32 to the primary winding 33 of a transformer 34. The transformer 34 has a secondary winding 35, one end of which is connected to a capacitive diode 2'' and the other end connected to the diode 4'' by means of a capacitor 38. The diode 2'' has a trimmer capacitor 36 connected in parallel therewith and the diode 4'' has a trimmer capacitor 37 connected in parallel therewith. It can be seen that the opposite ends of the capacitors 36, 2'', 4'' and 37 are all connected to ground potential.

The opposite electrodes of the capacitor 38 are respectively connected to terminals 64 and 65. To these terminals 64 and 65 can be applied the switching voltage $+V_B$ or $-V_B$ as desired.

The capacitance of the capacitor 38 is large compared to the diode capacitance of the capacitive diode 4''. The capacitance of the diode 4'' is selected for operation in the frequency band I.

The capacitance of the diode 2'' is selected for operation in the frequency band III. The switching voltage for the diode 2'' is applied to the terminal 64 and through a high frequency coil 39 and the secondary winding 35 to the diode 2''. The switching voltage for the diode 4'' is applied to the terminal 65 and to the diode by means of the resistor 40.

The output signals from the resonant circuits made up of the winding 35 and the diodes 2'' and 4'' are applied by means of a coupling capacitor 41 to the base of a transistor 42. The base of the transistor 42 has a bias voltage applied thereto by way of the terminal 66 and the resistor 43. Similarly, the emitter electrode of the transistor 42 has a bias voltage applied thereto by means of a terminal 67 and the resistor 44. The emitter electrode of the transistor 42 is connected to ground potential by means of the capacitor 45.

The amplified signals from the transistor 42 are taken from the resonant circuit 46 and applied to the following stage by means of a capacitor 47.

With the arrangement thus far described in FIGURE 4, the transistor 42 has a different input resistance for the two different frequency bands I and III. This has the disadvantage that the circuits are not matched properly, whereby the signal-to-noise ratio will be adversely affected. To avoid this disadvantage of the unmatched input impedances, the coupling capacitor 41 is connected to a tap 48 on the resonant circuit inductance winding 35. The tapping point 48 is so chosen that the number of turns of the winding between the tap 48 and the diode 2'' is greater than the number of turns of the winding between the tap 48 and the diode 4''. In a practical embodiment that has been used, the ratio of the turns was 5:2.

With the above arrangement, it can be seen that input resistance of the transistor 42 will be different for each of the two frequency bands and thus the input impedance will be properly matched, thereby improving the signal-to-noise ratio.

Figure 5:
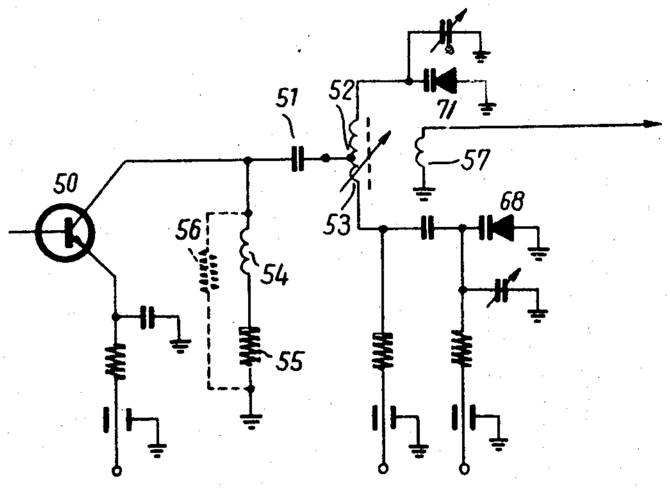
FIGURE 5 is an electrical schematic diagram of a fourth embodiment of the present invention.

Referring now to FIGURE 5, a circuit arrangement is shown whereby any amplification differences for the two frequency bands are equalized. This is accomplished by connecting the output or collector electrode of the transistor 50 by means of a capacitor 51 to a tapping point 52 of the resonant circuit inductor 53. As in FIGURE 1, the opposite ends of the inductor 53 are respectively connected to ground by means of diodes 71 and 68.

The output or collector electrode of the transistor 50 is connected to ground by means of a high frequency coil 54 and a resistor 55. Similarly, the output electrode may be connected to a source of operating potential rather than to ground potential. In parallel with the series circuit made up of the choke 54 and the resistor 55 can be connected a resistor 56 which is shown in dotted lines. The output signals from the resonant circuit are taken by means of the secondary coil 57 which is coupled with the inductance of the inductor 53.

The operation of the circuit is otherwise similar to that described with respect to FIGURES 1 and 4.

In the above-described circuits, the capacitive diodes can be made from semiconductor elements. Also, the circuits can advantageously be formed by using microstrip-techniques.

It will be understood that the above description of the present invention is susceptible to various modifications, changes, and adaptations, and the same are intended to be comprehended within the meaning and range of equivalents of the appended claims.

What is claimed is:

1. An electrical circuit capable of oscillating in a plurality of different frequency regions, comprising in combination:

(a) an oscillatory resonant circuit including an inductor;

(b) a plurality of capacitive diodes arranged in series with said inductor, the capacitance of a first of said diodes being selected to resonate with the inductance of said inductor in a first preselected frequency region and the capacitance of a second of said diodes being selected to resonate with said inductance in a second and different preselected frequency region;

(c) voltage means connected in circuit with said diodes for varying the conductive conditions and the capacitance of said diodes whenever desired; and (d) a switch provided in circuit between said voltage means and said diodes, said switch being operable into a first position wherein a fixed voltage is applied to said first diode for placing the same in conductive condition and a variable tuning voltage is applied to said second diode and into a second position wherein the circuit positions of said first and second diodes are exchanged.

2. An electrical circuit in accordance with claim 1 wherein said voltage means tunes two or more of said plurality of diodes in the attenuation band of a third preselected frequency region.

3. An electrical circuit in accordance with claim 1 wherein said resonant circuit is in the form of a coaxial line resonator having an inner and outer conductor and wherein a coil is connected between said outer conductor and a position on said inner conductor corresponding substantially to a voltage null position.

4. An electrical circuit in accordance with claim 1 wherein a capacitor is provided between said first and second diodes, the capacitance of said capacitor being substantially larger than the basic capacitance of said capacitive diodes.

5. An electrical circuit in accordance with claim 1 wherein amplifier means having amplifier input and output impedances are connected in circuit with said resonant circuit, said amplifier means being connected to a tap position of said inductor of said resonant circuit, said tap position being selected so that the impedance at said tap position substantially matches one of said amplifier impedances of said amplifier means in said first and second switch positions of said switch.

6. An electrical circuit in accordance with claim 5 wherein said tap position is selected so that one of said input and output impedances of said amplifier means is matched for said plurality of different frequency regions.

7. An electrical circuit in accordance with claim 5 wherein said capacitive diodes have different basic capacitance and the diode having the smaller basic capacitance is coupled with the larger number of turns of said inductor and said capacitive diode having the larger basic capacitance is coupled to the smaller number of turns of said inductor.

8. An electrical circuit capable of oscillating in a plurality of different frequency regions, comprising in combination:

(a) an oscillatory resonant circuit including an inductor;

(b) a plurality of capacitive diodes arranged in series with said inductor, the capacitance of a first of said diodes being selected to resonate with the inductance of said inductor in a first preselected frequency region and the capacitance of a second of said diodes being selected to resonate with said inductance in a second preselected frequency region;

(c) voltage means including a fixed reference potential, a switching voltage and a tuning voltage, said first diode being connected in circuit between one end of said inductor and said fixed reference potential;

(d) a capacitor connected between the other end of said inductor and said second capacitive diode, said capacitor having two electrodes; and (e) means for selectively coupling said switching voltage to one of said electrodes of said capacitor and said tuning voltage to the other of said electrodes of said capacitor and vice versa to tune said electrical circuit to one or another of said plurality of frequency regions.

References Cited

UNITED STATES PATENTS

| | | | |
|---|---|---|---|
| 3,354,397 | 11/1967 | Wittig | 334—15 X |
| 3,067,394 | 12/1962 | Zimmerman et al. | 331—36 |
| 3,109,995 | 11/1963 | Wargo | 334—15 X |

ROY LAKE, *Primary Examiner.*

S. H. GRIMM, *Assistant Examiner.*